United States Patent
Minagawa

(10) Patent No.: US 8,049,232 B2
(45) Date of Patent: Nov. 1, 2011

(54) ORGANIC EL ELEMENT HAVING A PLURALITY OF LIGHT EMITTING LAYERS

(75) Inventor: Masahiro Minagawa, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 453 days.

(21) Appl. No.: 12/280,080

(22) PCT Filed: Feb. 7, 2007

(86) PCT No.: PCT/JP2007/052077
§ 371 (c)(1),
(2), (4) Date: Aug. 20, 2008

(87) PCT Pub. No.: WO2007/097192
PCT Pub. Date: Aug. 30, 2007

(65) Prior Publication Data
US 2010/0224863 A1    Sep. 9, 2010

(30) Foreign Application Priority Data
Feb. 20, 2006  (JP) .................... 2006-041923

(51) Int. Cl.
*H01L 33/08* (2010.01)
*H01L 33/26* (2010.01)
*H01L 51/50* (2010.01)

(52) U.S. Cl. ....... 257/97; 257/40; 257/98; 257/E51.018; 313/506

(58) Field of Classification Search .......... 257/40, 257/94, 96, 97
See application file for complete search history.

(56) References Cited

U.S. PATENT DOCUMENTS

| | | | |
|---|---|---|---|
| 2005/0007322 A1* | 1/2005 | Adachi et al. ............ | 345/82 |
| 2005/0077816 A1* | 4/2005 | Yamada et al. ........... | 313/503 |
| 2005/0285516 A1 | 12/2005 | Godo et al. | |

FOREIGN PATENT DOCUMENTS

| | | |
|---|---|---|
| EP | 0 193 322 A2 | 9/1986 |
| JP | 2000-68057 | 3/2000 |

(Continued)

OTHER PUBLICATIONS

Supplementary European Search Report issued in European Patent Application No. 07 71 3894, mailed Feb. 2, 2010.

*Primary Examiner* — Ha Tran T Nguyen
*Assistant Examiner* — Raj R Gupta
(74) *Attorney, Agent, or Firm* — McDermott Will & Emery LLP

(57) ABSTRACT

To provide an organic EL element in which the hue of display light can be restrained from varying according to a change of the viewing angle. The organic EL element includes: a first electrode (anode) 4 having translucency; an organic layer 7 at least including a charge injection transport layer (hole injection transport layer) 7a formed on the first electrode 4, and a plurality of light-emitting layers 7b, 7c formed on the charge injection transport layer 7a and different in emission color; and a second electrode (cathode) 8 formed on the organic layer 7. The organic EL element is characterized in that a total film thickness T of the first electrode 4 and the charge injection transport layer 7a is in such a range that change of hue of display light according to a viewing angle $\theta$ cannot be recognized.

5 Claims, 4 Drawing Sheets

FOREIGN PATENT DOCUMENTS

| | | |
|---|---|---|
| JP | 2004-047387 | 2/2004 |
| JP | 2005-31251 | 2/2005 |
| JP | 2005-235668 | 9/2005 |
| JP | 2005-317255 | 11/2005 |
| JP | 2006-032327 | 2/2006 |
| JP | 2006-040881 | 2/2006 |
| JP | 2006-244713 | 9/2006 |
| WO | WO 00/60905 | 10/2000 |

* cited by examiner

ORGANIC EL ELEMENT HAVING A PLURALITY OF LIGHT EMITTING LAYERS

RELATED APPLICATIONS

This application is the U.S. National Phase under 35 U.S.C. §371 of International Application No. PCT/JP2007/052077, filed on Feb. 7, 2007, which in turn claims the benefit of Japanese Application No. 2006-041923, filed on Feb. 20, 2006, the disclosures of which Applications are incorporated by reference herein.

TECHNICAL FIELD

The present invention relates to an organic EL element having a plurality of light-emitting layers exhibiting different emission colors.

BACKGROUND ART

As an organic EL element, there was heretofore known an element which was formed in such a manner that a transparent electrode made of ITO (Indium Tin Oxide) or the like as an anode, an organic layer including a hole injection layer, a hole transport layer, a light-emitting layer and an electron transport layer, and an opaque back electrode made of aluminum (Al) or the like as a cathode were laminated successively. For example, as disclosed in Patent Document 1, there was a known element in which at least two kinds of light-emitting layers exhibiting different emission colors were laminated as the light-emitting layer. In such an organic EL element, when the light-emitting layers exhibiting different emission colors are laminated, display light with a predetermined color can be obtained by color mixing. For example, when a blue light-emitting layer and a yellow light-emitting layer are laminated, white display light can be obtained by color mixing.

DISCLOSURE OF THE INVENTION

Problems that the Invention is to Solve

An organic EL panel using such an organic EL element, however, has a problem that the hue of display light is different from a target hue according to the user's viewing angle because the chromaticity of display light recognized by a user varies widely according to the change of a viewing angle θ. It is conceived that such a problem is caused by change of a light interference condition according to a light outgoing direction because the organic EL element has a laminated structure of a plurality of layers and the optical path length of light emitted from each light-emitting layers vary according to outgoing direction of the light.

FIG. 6 is a graph showing the relation between viewing angle θ and CIE chromaticity coordinates expressing the chromaticity of display light in a background-art organic EL element which is formed so that a yellow light-emitting layer and a blue light-emitting layer are laminated as the light-emitting layers. Incidentally, the viewing angle θ=0° shows a state where a display surface of an organic EL panel having an organic EL element is viewed from the front. The background-art organic EL element is a dot matrix type organic EL element. The yellow light-emitting layer is formed in such a manner that a host material such as IDE120 manufactured by Idemitsu Kosan Co., Ltd. is doped with a light-emitting material exhibiting yellow as the emission color such as a naphthacene derivative, and that a hole transport material such as α-NPD or the like is further added thereto. The blue light-emitting layer is formed in such a manner that a host material the same as in the yellow light-emitting layer is doped with a light-emitting material exhibiting blue as the emission color such as BD102 manufactured by Idemitsu Kosan Co., Ltd., and that the hole transport material is further added thereto. As represented by characteristic S3, the x and y values of the CIE chromaticity coordinates in the background-art organic EL element varies widely according to the change of the viewing angle θ from 0° to 50°. Particularly when the y value of the CIE chromaticity coordinates changes to a value smaller than the value at the viewing angle θ=0° in the condition that the viewing angle θ=0° shows white, the display light becomes so reddish that the user can recognize the change of the hue easily but switching to red display is generally often used for alarm display. For this reason, there is a problem that the user may misunderstand it for some kind of alarm display.

In consideration of such a problem, an object of the present invention is to provide an organic EL element in which the hue of display light can be restrained from varying according to a change of the viewing angle.

Means for Solving the Problem

To solve the aforementioned problem, the organic EL element according to the invention is an organic EL element including: a first electrode having translucency; an organic layer at least including a charge injection transport layer formed on the first electrode and a plurality of light-emitting layers formed on the charge injection transport layer and different in emission color; and a second electrode formed on the organic layer; the organic EL element characterized in that a total film thickness of the first electrode and the charge injection transport layer is in such a range that change of hue of display light according to a viewing angle cannot be recognized.

To solve the aforementioned problem, the organic EL element according to the invention is an organic EL element including: a first electrode having translucency; an organic layer at least including a charge injection transport layer formed on the first electrode, and a plurality of light-emitting layers formed on the charge injection transport layer and different in emission color; and a second electrode formed on the organic layer; the organic EL element characterized in that a total film thickness of the first electrode and the charge injection transport layer is in such a range that a variation of a y value of CIE chromaticity coordinates expressing chromaticity of display light according to reduction of the total film thickness is not smaller than zero.

The organic EL element is characterized in that the total film thickness of the first electrode and the charge injection transport layer is 300 nm or less.

The organic EL element is characterized in that each of the light-emitting layers contains a charge transport material.

The organic EL element is characterized in that a concentration of the charge transport material in each light-emitting layer is 20% or more.

The organic EL element is characterized in that display light emitted from the light-emitting layers exhibits white by color mixing.

Effect of the Invention

The present invention relates to an organic EL element having a plurality of light-emitting layers exhibiting different emission colors, in which the hue of display light can be restrained from varying according to a change of the viewing angle.

Figure 1:
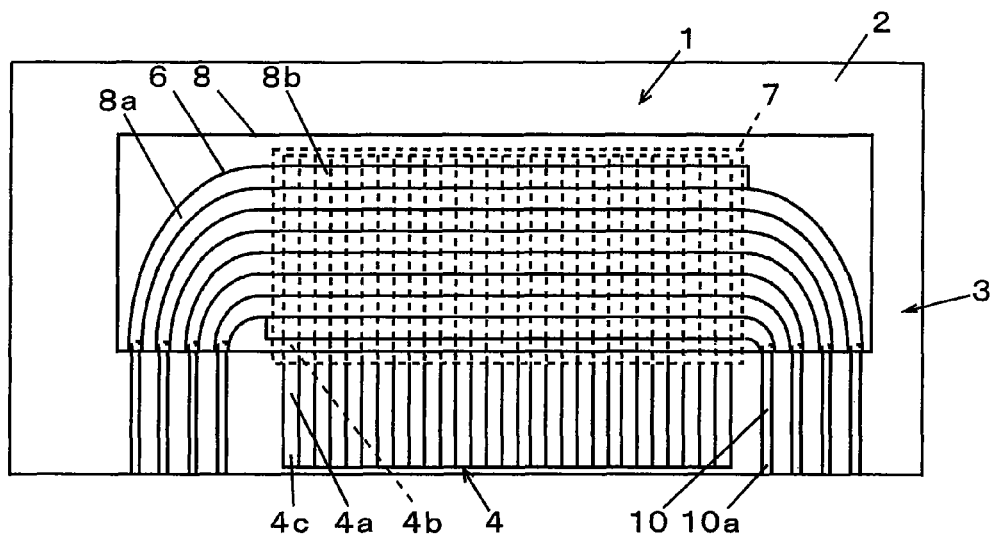
FIG. 1 A view showing an organic EL panel as an embodiment of the invention.

DESCRIPTION OF THE REFERENCE NUMERALS 1 organic EL panel
2 support board
3 organic EL element
4 anode (first electrode)
4a anode wiring portion
4b anode portion
4c anode terminal portion
5 insulating layer
5a opening portion
6 partition wall
7 organic layer
7a hole injection transport layer (charge injection transport layer)
7b first light-emitting layer
7c second light-emitting layer
7d electron transport layer
7e electron injection layer
8 cathode (second electrode)
8a cathode wiring portion
8b cathode portion
10 connection wiring portion
10a cathode terminal portion

BEST MODE FOR CARRYING OUT THE INVENTION

An embodiment of the invention applied to a dot matrix type organic EL panel will be described below with reference to the accompanying drawings.

FIG. 1 is a view showing a dot matrix type organic EL panel 1. The organic EL panel 1 has an organic EL element 3 formed on a support board 2. Light emitted from the organic EL element 3 is extracted from the support board 2 side. White display light is obtained by color mixing of yellow light and blue light emitted from first and second light-emitting layers which will be described later. Although a sealing member is disposed on the support board 2 so that the organic EL element 3 is hermetically sealed with the sealing member, the sealing member is not shown in FIG. 1.

The support board 2 is an electrically insulating board made of a rectangular transparent glass material.

Figure 2:
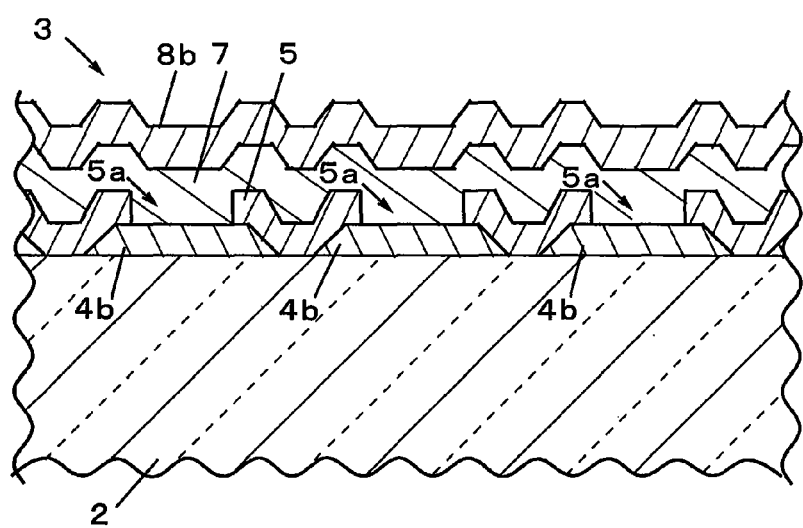
FIG. 2 An enlarged sectional view showing an organic EL element in the organic EL panel.

As shown in FIG. 2, the organic EL element 3 mainly includes plural anodes (first electrode) 4 shaped like lines, an insulating layer 5, partition wall portions 6, an organic layer 7, and plural cathodes (second electrode) 8 shaped like lines. Plural light-emitting pixels which are formed in such a manner that the organic layer 7 is held between the anodes 4 and the cathodes 8 are provided at points of intersection of the lines of the each anode 4 and the lines of the each cathode 8.

The anode 4 is made of a translucent electrically conductive material such as ITO. The anode 4 is shaped like lines in such a manner that the electrically conductive material is formed as a layer on the support board 2 by a sputtering method or the like and then the layer is formed into lines substantially parallel with one another by a photolithography method or the like. The anode 4 has anode wiring portions 4a, and anode portions 4b. Each anode wiring portion 4a has an anode terminal portion 4c at the terminal portion.

The insulating layer 5 is made of an electrically insulating material such as a polyimide compound. The insulating layer 5 is formed on the anode 4 so as to be located between the anode 4 and the cathode 8 and has opening portions 5a from which the anode portions 4b are exposed. The insulating layer 5 prevents short-circuiting between the two electrodes 4 and 8 and clarifies the contour of the organic EL element 1.

The partition wall portions 6 are made of an electrically insulating material such as a phenol compound. The partition wall portions 6 are formed on the insulating layer 5. Each partition wall portion 6 is formed by a photolithography method or the like so that a section of the partition wall portion 6 is shaped like an overhang such as a reverse taper with respect to the insulating layer 5. The partition wall portions 6 are formed at equal intervals in a direction perpendicular to the anode 4. When the organic layer 7 and a metal layer serving as the cathode 8 are formed from above the partition wall portions 6 by an evaporation method, a sputtering method or the like, a structure in which the organic layer 7 and the metal film are stepped cut is obtained by the overhang shapes of the partition wall portions 6.

Figure 3:
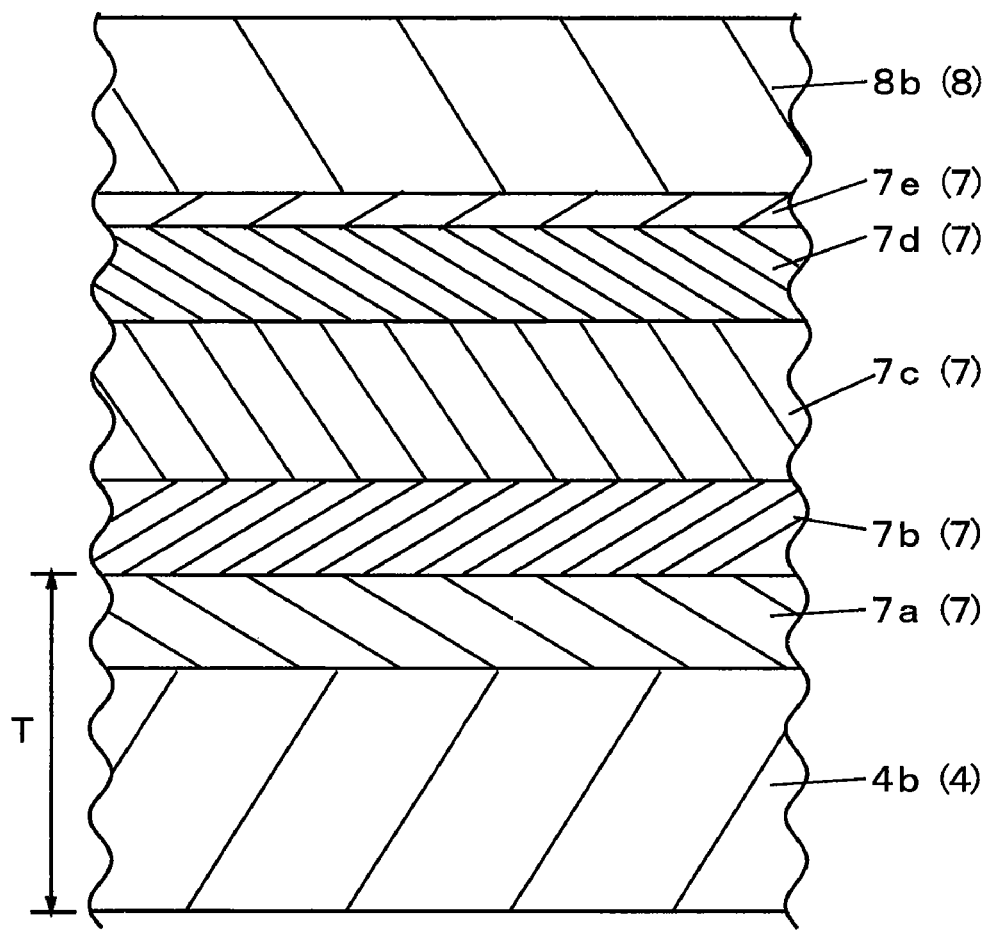
FIG. 3 An enlarged sectional view showing the organic EL element.

The organic layer 7 is formed to have areas of a predetermined size corresponding to the window portion 5a-forming portions of the insulating layer 5 so as to be located at least on the anode portions 4b. As shown in FIG. 3, the organic layer 7 is formed in such a manner that a hole injection transport layer (charge injection transport layer) 7a, a first light-emitting layer 7b, a second light-emitting layer 7c, an electron transport layer 7d and an electron injection layer 7e are laminated successively by an evaporation method or the like.

The hole injection transport layer 7a has a function of fetching holes from the anode 4 and transmitting the holes to the first light-emitting layer 7b. The hole injection transport layer 7a is formed in such a manner that a hole transport material (charge transport material) such as α-NPD is formed as a layer by an evaporation method or the like.

The first light-emitting layer 7b is formed as a layer, for example, having a film thickness of about 20 nm in such a manner that the hole transport material for forming the hole injection transport layer 7a and a first light-emitting material such as a naphthacene derivative having a function of emitting light in response to recombination of electrons and holes and exhibiting yellow emission are mixed with a host material by a co-evaporation method or the like. The host material is an organic material such as IDE120 (made by Idemitsu Kosan Co., Ltd.) capable of transporting holes and electrons and having hole transport characteristic with high hole mobility. The first light-emitting layer 7b is formed so that the concentration of the hole transport material in the whole of the layer is 20% or more.

The second light-emitting layer 7c is formed as a layer, for example, having a film thickness of about 30 nm in such a manner that the hole transport material for forming the hole injection transport layer 7a and a second light-emitting material such as BD102 (made by Idemitsu Kosan Co., Ltd.) having a function of emitting light in response to recombination of electrons and holes and exhibiting blue emission are mixed with the same host material as in the first light-emitting layer 5b by a co-evaporation method or the like. The host material is capable of transporting holes and electrons. The second light-emitting layer 7c is formed so that the concentration of the hole transport material in the whole of the layer is 20% or more.

The electron transport layer 7d has a function of transporting electrons to the second light-emitting layer 5c. The electron transport layer 7d is formed in such a manner that an electron transport material which is a chelate compound such as aluminum quinolinol (Alq3) is formed as a layer having a film thickness of 20 to 60 nm by an evaporation method or the like.

The electron injection layer 7e has a function of injecting electrons from the second electrode 8 and is formed in such a manner that lithium fluoride (LiF) or the like is formed as a layer having a film thickness of about 1 nm by an evaporation method or the like.

The cathode 8 is shaped like lines in such a manner that a metallic electrically conductive material such as aluminum (Al) or magnesium silver (Mg:Ag) having higher electrical conductivity than that of the anode 4 is stratified as a metal film by an evaporation method or the like and then the metal film is stepped cut by the partition wall portions 6. The cathode 8 has cathode wiring portions 8a each shaped like a circular arc, and cathode portions 8b substantially crossing at right angles (intersecting) the anode portions 4b of the anode 4. The cathode wiring portions 8a are electrically connected to connection wiring portions 10 respectively. The connection wiring portions 10 are formed together with the anode 4 and made of the same material ITO. Each connection wiring portion 10 has a cathode terminal portion 10a formed as a trailer portion.

The organic EL panel 1 is formed in the aforementioned manner.

Figure 4:
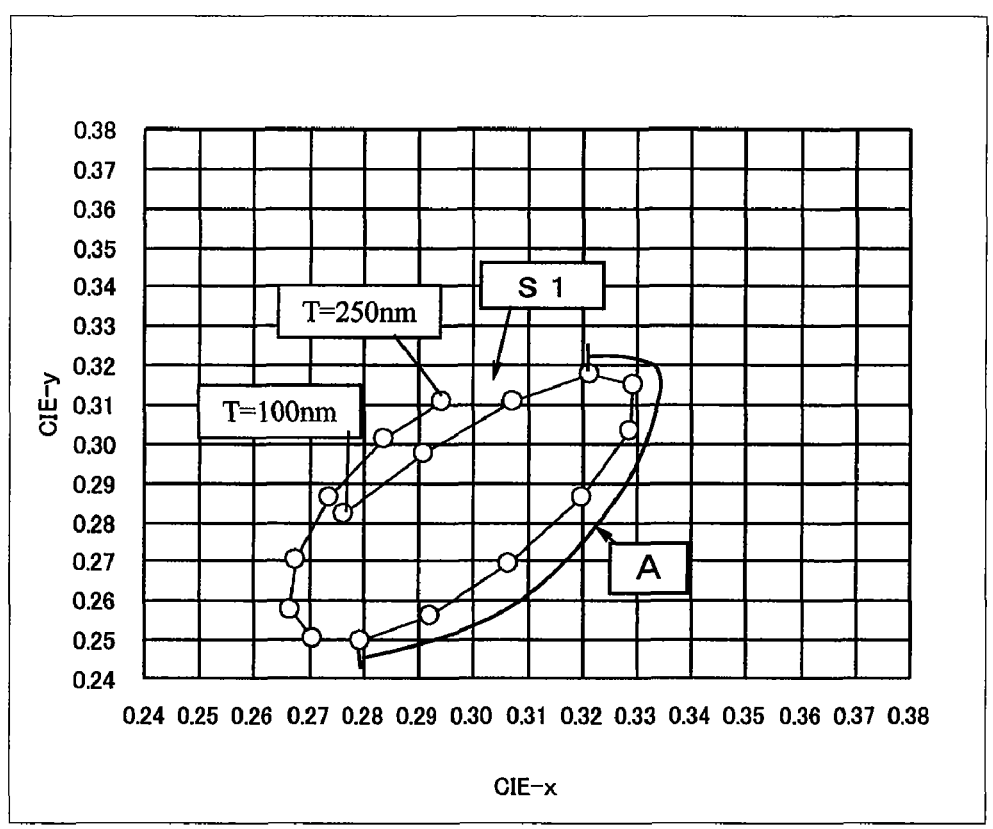
FIG. 4 A graph showing the relation between total film thickness T and chromaticity of display light in the organic EL element.
Figure 6:
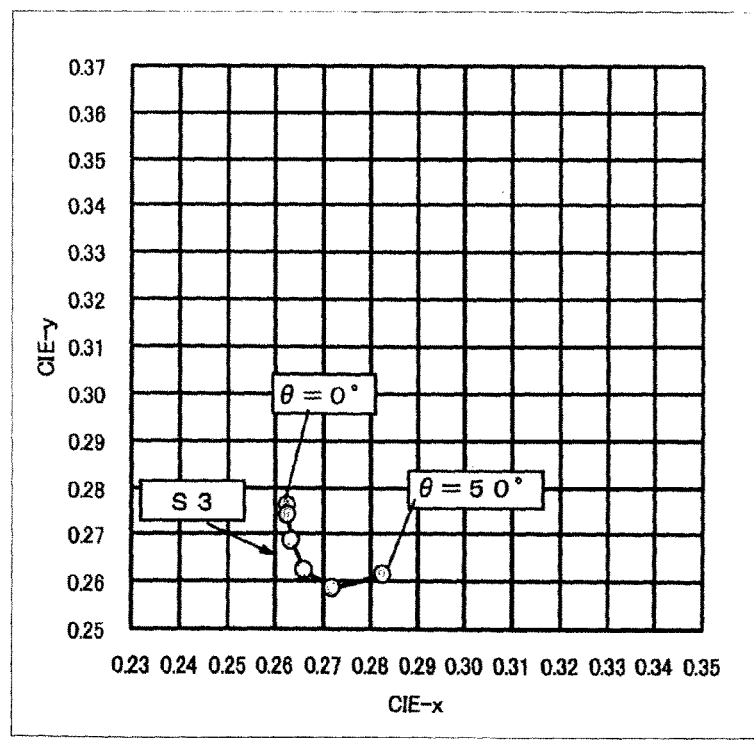
FIG. 6 A graph showing the relation between viewing angle θ and chromaticity of display light in a background-art organic EL element.

The organic EL element 3 is provided so that the total film thickness T which is the sum of the film thickness of the anode portions 4b of the anode 4 as the first electrode on the display surface side and the film thickness of the hole injection transport layer 7a is in such a range that change of the hue of display light according to the viewing angle θ cannot be recognized. It is preferable that a variation of the metric hue angle of display light according to the viewing angle θ is in a range of ±9° (further preferably ±5°) so that "change of the hue of display light according to the viewing angle θ cannot be recognized". As for a specific range of the total film thickness T, the total film thickness T is 300 nm or less and in such a range that a variation ΔCIE.y of the y value of the CIE chromaticity coordinates expressing chromaticity of display light according to reduction of the total film thickness T is zero or more. FIG. 4 is a graph showing the relation between reduction of the total film thickness T and the CIE chromaticity coordinates of display light in the organic EL element 3. Incidentally, assume that the size and drive condition of the organic EL element 3 are the same as those of the background-art organic EL element in FIG. 6, and that the viewing angle θ is fixed at 0°. As shown in FIG. 4, characteristic S1 expressing dependency of chromaticity of display light on reduction of the total film thickness T exhibits an elliptic locus. The present inventor has found that dependency of chromaticity of display light on reduction of the total film thickness T and dependency of chromaticity of display light on the viewing angle θ have relevance to each other, and that the y value of the CIE chromaticity coordinates of display light according to the change of the viewing angle θ has a tendency to be restrained from changing to a value smaller than the value at the viewing angle θ=0° when the total film thickness T is in such a range that a variation ΔCIE.y of the y value of the CIE chromaticity coordinates of display light according to reduction of the total film thickness T is zero or more (i.e. ΔCIE.y≧0). Incidentally, the "range that a variation of the y value of the CIE chromaticity coordinates of display light according to reduction of the total film thickness T is zero or more" is a range in which the y value of the CIE chromaticity coordinates is not reduced even when the total film thickness T is reduced. In FIG. 4, it is a range (130 nm≦T≦190 nm) represented by A. Incidentally, such a range varies according to the organic material forming the organic EL element and conditions such as a laminated structure.

Figure 5:
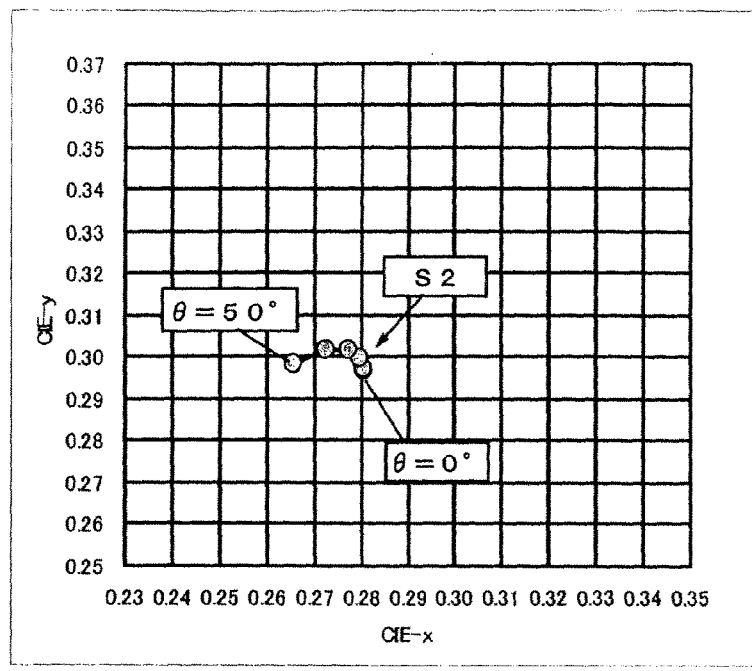
FIG. 5 A graph showing the relation between viewing angle θ and chromaticity of display light in the organic EL element.

FIG. 5 is a graph showing the relation between the viewing angle θ and the CIE chromaticity coordinates of display light when the total film thickness T of the anode portions 4b of the anode 4 and the hole injection transport layer 7a in the organic EL element 3 is 300 nm or more and in such a range that a variation ΔCIE.y of the y value of the CIE chromaticity coordinates of display light according to reduction of the total film thickness T is zero or more. Incidentally, assume that the size and drive condition of the organic EL element 3 are the same as those of the background-art organic EL element in FIG. 6. As shown in characteristic S2, the y value of the CIE chromaticity coordinates of display light is prevented from changing to a value smaller than the value at the viewing angle θ=0° even when the viewing angle θ changes in a range of from 0° to 50°. Accordingly, even when the viewing angle changes in a range of from 0° to 50°, white display light of the organic EL element 3 does not become reddish so that the change of the hue can be restrained in such a range that it cannot be recognized by the user. Incidentally, although it is preferable that the y value of the CIE chromaticity coordinates also does not change to a value smaller than the value at the viewing angle θ=0° even when the viewing angle θ is not smaller than 50°, it can be said that the change of the hue according to the viewing angle θ is restrained sufficiently as long as the aforementioned effect can be obtained according to the change of the viewing angle θ in a range of from 0° to 50° in the general display panel for recognizing the display surface from the front direction. Moreover, setting the total film thickness T to be 300 nm or less permits reduction of the optical path length difference generated according to the outgoing angle of light and permits reduction of the variation of chromaticity of display light according to the viewing angle θ. Incidentally, it is obvious from FIGS. 5 and 6 that variations of the x and y values of the CIE chromaticity coordinates of display light according to a change of the viewing angle θ in the organic EL element 3 are reduced compared with those in the background-art organic EL element.

Such an organic EL element 3 includes: an anode 4 having translucency; an organic layer 7 at least including a hole injection transport layer 7a formed on the anode 4, and first and second light-emitting layers 7b, 7c formed on the hole injection transport layer 7a and different in emission color; and a cathode 8 formed on the organic layer 7; wherein the total film thickness T of the anode 4 and the hole injection transport layer 7a is in such a range that the change of the hue of display light according to the viewing angle cannot be recognized. As for this range, the total film thickness T of the anode 4 and the hole injection transport layer 7a is in such a range that a variation ΔCIE.y of the y value of the CIE chromaticity coordinates expressing chromaticity of display light according to reduction of the total film thickness T is zero or more.

When the organic EL element 3 has such characteristic, the display color can be restrained from becoming reddish particularly in the condition of white display even when the viewing angle θ changes. Accordingly, the hue of display light can be restrained from varying according to the viewing angle θ.

When the total film thickness T of the anode 4 and the hole injection transport layer 7a is set to be 300 nm or less, the optical path length difference generated according to the outgoing angle of light can be reduced so that the chromaticity of display light can be restrained from varying according to the viewing angle θ.

Although this embodiment has been described upon the case where the invention is applied to an organic EL panel having the dot matrix type organic EL element 3, the organic EL element according to the invention can be applied also to a segment type organic EL element.

Although the organic EL element 3 in this embodiment is configured to have two light-emitting layers, i.e. the first and second light-emitting layers 7b and 7c, the organic EL element according to the invention may have three or more light-emitting layers or a plurality of light-emitting materials different in emission colors may be mixed in one light-emitting layer.

INDUSTRIAL APPLICABILITY

The invention is applied to an organic EL element having a plurality of light-emitting layers exhibiting different emission colors and is adapted to an organic EL display having such an organic EL element.

The invention claimed is:

1. An organic electroluminescent (EL) element comprising:
   a first electrode having translucency;
   an organic layer at least including a charge injection transport layer formed on the first electrode, and a plurality of light-emitting layers formed on the charge injection transport layer and different in emission color; and
   a second electrode formed on the organic layer, wherein a total film thickness of the first electrode and the charge injection transport layer is in such a range that a variation of a y value of International Commission on Illumination (CIE) chromaticity coordinates expressing chromaticity of display light according to a reduction of the total film thickness is zero or more.

2. The organic EL element according to claim 1, wherein the total film thickness of the first electrode and the charge injection transport layer is 300 nm or less.

3. The organic EL element according to claim 1, wherein display light emitted from the light-emitting layers exhibits white by color mixing.

4. The organic EL element according to claim 1, each of the light-emitting layers contains a charge transport material.

5. The organic EL element according to claim 4, wherein a concentration of the charge transport material in each light-emitting layer is 20% or more.

* * * * *